United States Patent [19]

Voorman et al.

[11] 3,921,102

[45] Nov. 18, 1975

[54] CIRCUIT ARRANGEMENT INCLUDING A GYRATOR RESONANT CIRCUIT

[75] Inventors: Johannes Otto Voorman; Nicolaas Van Hurck; Arnoldus Biesheuvel, all of Eindhoven, Netherlands

[73] Assignee: U.S. Philips Corporation, New York, N.Y.

[22] Filed: July 17, 1974

[21] Appl. No.: 489,370

[30] Foreign Application Priority Data

July 23, 1973 Netherlands ....................... 7310195

[52] U.S. Cl. .................... 332/9 R; 329/104; 331/25; 331/117 R; 331/177 R; 332/29 M; 332/37 D; 330/17; 330/18; 333/80 R; 334/14

[51] Int. Cl.² .. H03K 7/02; H03K 9/00; H03B 5/00; H03H 11/00

[58] Field of Search .................. 333/80 R, 80 T, 17; 329/104; 332/9 R; 331/132, 25, 117 R, 177 R; 334/14

[56] References Cited

UNITED STATES PATENTS

| | | | |
|---|---|---|---|
| 3,475,690 | 10/1969 | Hurtig | 333/80 R X |
| 3,539,943 | 11/1970 | Sheahan | 333/80 T X |
| 3,725,799 | 4/1973 | Cubbison, Jr. | 333/80 T X |
| 3,824,496 | 7/1974 | Hekimian | 333/80 R X |

*Primary Examiner*—Paul L. Gensler
*Attorney, Agent, or Firm*—Frank R. Trifari; George B. Berka

[57] ABSTRACT

Circuit arrangement including a gyrator resonant circuit which is equipped with a plurality of controllable current multipliers, the resonance frequency $f_o$ and the quality factor Q of the circuit being capable of being instantaneously varied independently of one another by control of the said controllable current multipliers.

7 Claims, 4 Drawing Figures

CIRCUIT ARRANGEMENT INCLUDING A GYRATOR RESONANT CIRCUIT

Figure 1:
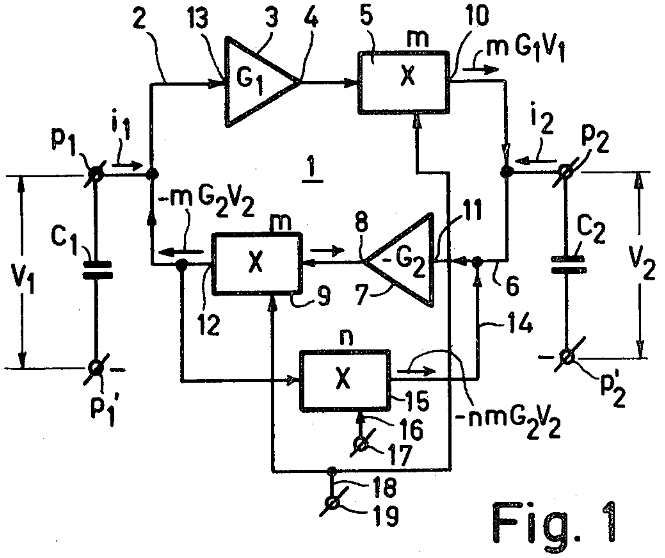

The invention relates to a circuit arrangement using a resonant circuit in the form of a gyrator having a first port and a second port which each are terminated by a capacitor.

As is well known, in circuit arrangements of the above described type the gyrator transforms the capacitor connected to its output port into a synthetic inductance which together with the capacitor connected to the gyrator input port forms the resonant circuit. The gyrator has the known property that in principle the value of the synthetic inductance may simply be varied by varying the gyrator constant G, which means that by varying the adjustment of variable resistors or by selecting the quotient of emitter surface areas in the current mirrors used in the gyrator circuit the tuning of the resonant circuit may be varied in a very simple manner.

The value of the quality factor Q of the resonant circuit realized by means of the gyrator generally is regarded as a measure of the usefulness of such a circuit arrangement. Suitable use of bipolar monolithic structures permits of realizing gyrator resonant circuits which are tunable in frequency over several octaves and moreover have a comparatively high Q factor. A disadvantage of the said known circuit arrangements is, however, that their designs have to satisfy exacting parametric requirements and this restricts the field of practical use.

It is an object of the present invention to realize a considerably increased flexibility of a circuit arrangement of the abovedescribed type by adding a small number of elementary building blocks, resusting in a notable expansion of the field of use.

For this purpose the circuit arrangement according to the invention is characterized in that the gyrator has a first series circuit comprising a (first) voltage-controlled current source (VCCS) of positive transconductance to the output of which a first controllable current multiplier is connected, and a second series circuit comprising a (second) voltage-controlled current source of negative transconductance to the output of which a second controllable current multiplier is connected, the output of the said first controllable current multiplier and the input of the said second voltage-controlled current source being interconnected so as to form the said second gyrator port, whilst the output of the said second controllable current multiplier and the input of the said first voltage-controlled current source are interconnected to form the said first gyrator port, and in that the said gyrator further includes at least one capacitor leakage current circuit which is connected between one of the gyrator ports and the input of the voltage-controlled current source coupled to the other port and includes at least one third controllable current multiplier, a first control current circuit which for adjustment of the circuit quality factor Q is connected to a control input of the said third controllable current multiplier, and a second control current circuit which for adjustment of the resonant frequence $f_o$ is connected to a control input common to the said first and second controllable current multipliers.

The use of the measures according to the invention provides the important advantage that both the resonant frequency $f_o$ and the quality factor Q are adjustable instantaneously and independently of one another.

When a second control current circuit is used which is constituted by the output circuit of a phase discriminator to which are applied an input signal applied to the resonant circuit and an output signal from said circuit, there will appear, if the frequency of the said input signal differs from the tuning frequency of the resonant circuit, at the output of the phase discriminator an output signal which when supplied as a control current to the first and second current multipliers causes the tuning frequency of the resonant circuit to follow the frequency of the said input signal, so that a frequency-tracking filter is obtained. Furthermore, if in addition the first control current circuit is formed by the output circuit of a control loop for automatic quality factor control (AQC), the amplitude of the output signal from the frequency-tracking filter will remain constant. Such a circuit arrangement may be used for various purposes, for the resonant circuit provides the filtered signal with a constant amplitude (AQC), whilst the output signal from the phase discriminator is a measure of the frequency modulation of the input signal. The AQC signal applied to the first control circuit is a measure of the amplitude of the input signal to the resonant circuit. Hence such a circuit arrangement may be used as a detecting device for detecting FM or FSK signals or for detecting the carrier wave of a received amplitude and-/or frequency modulated signal applied to the input of the circuit arrangement.

With suitably chosen proportioning the gyrator resonant circuit may operate as an oscillator, the use of the steps according to the invention again permitting the field of use to be expanded. Thus the circuit arrangement according to the invention may be used as an ideal oscillator modulator for generating, for example, frequency-modulated signals. The modulating signal then is applied to the control current circuit for the frequency control, whilst the amplitude of the resulting frequency-modulated signal can be maintained constant by a control signal applied to the control current circuit for Q control. Such a circuit arrangement is particularly suitable for generating FSK signals, because frequency control is instantaneously effected.

Embodiments of the invention will now be described by way of example, with reference to the accompanying drawings, in which:

FIG. 1 is a circuit diagram showing schematically the basic elements of a circuit arrangement including a gyrator resonant circuit according to the invention.

Figure 2:
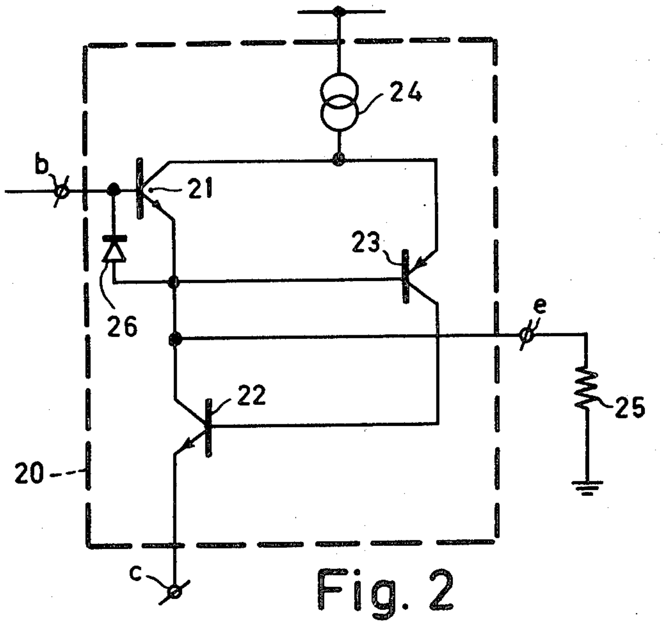
Figure 3:
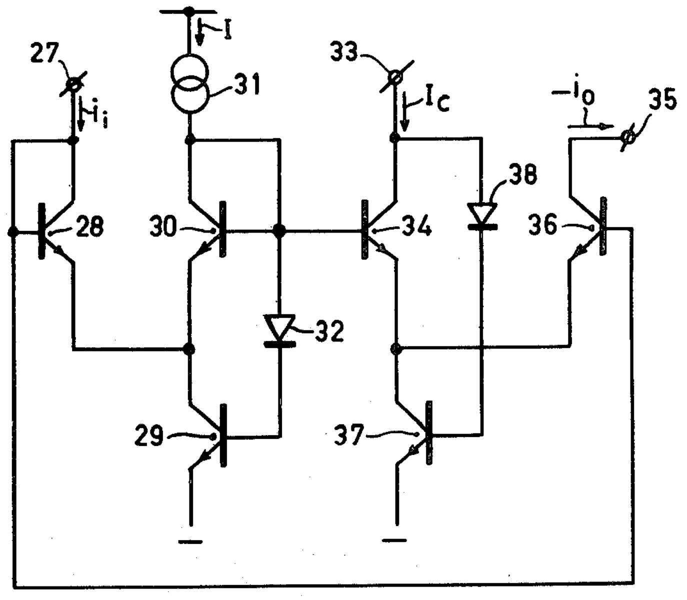
Figure 4:
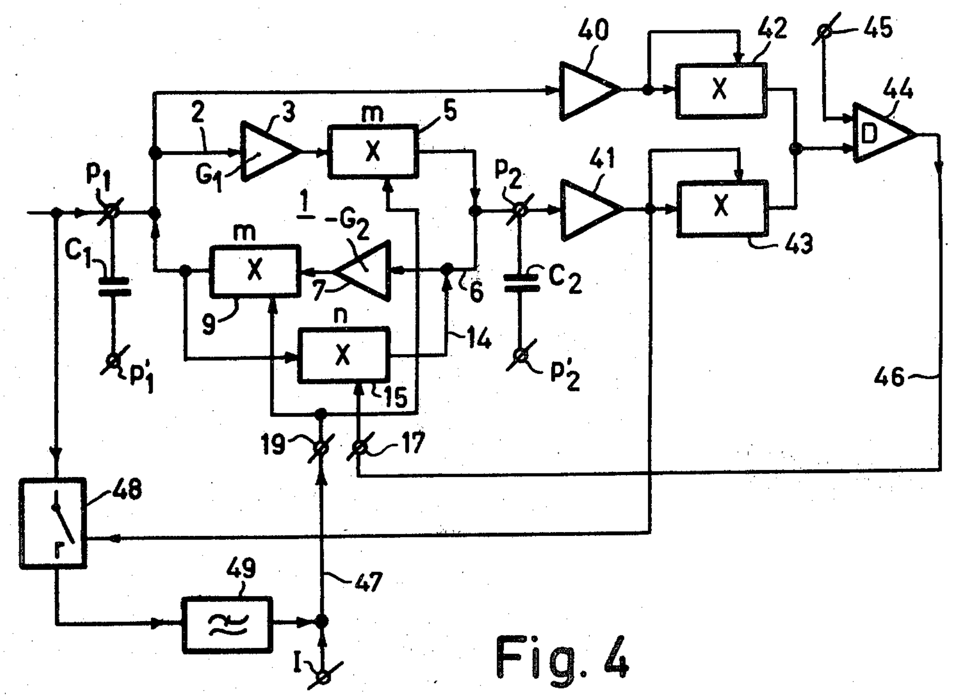

FIG. 2 shows a possible embodiment of a voltage-controlled current source which may be used in the circuit arrangement of FIG. 1, FIG. 3 shows a possible embodiment of a controlable current multiplier which may be used in the circuit arrangement of FIG. 1, and FIG. 4 is a block diagram of a circuit arrangement according to FIG. 1 which is provided with a first control loop by which the amplitude of the output signal is maintained constant and with a second control loop for automatic frequency control of the resonant circuit.

Referring to FIG. 1, there is shown a gyrator 1 having a first port $p_1$–$p_1'$ and a second port $p_2$–$p_2'$. The first port $p_1$–$p_1'$ is terminated by a capacitor $C_1$ and the second port $p_2$–$p_2'$ is terminated by a capacitor $C_2$. A gyrator fundamentally comprises tow inversely parallel connected stages of positive transconductance $G_1$ and negative transconductance $G_2$ respectively. Each stage is assumed to perform accurate conversion of a voltage into a current. Thus the gyrator transforms the capacitor $C_2$ connected to its second port $p_2$–$p_2'$ into a synthetic inductance $$L_{eq} = \frac{C_2}{G_1 G_2}$$

which together with the capacitor $C_1$ connected to the first port $p_1$–$p_1'$ forms a resonant circuit.

According to the invention a particularly flexible circuit arrangement having a wide field of use is obtained if the gyrator 1 includes a first series circuit 2, which comprises a first voltage-controlled current source (VCCS) 3 of positive transconductance and a first controllable current multiplier 5 connected to the output 4 of this current source, and a second series circuit 6, which comprises a second voltage-controlled current source 7 of negative transconductance and a second controllable current multiplier 9 connected to the output 8 of said second current source, the output 10 of the said first controllable current multiplier 5 and the input 11 of the said second voltage-controlled current source 7 being interconnected to form the said second gyrator port $p_2$–$p_2'$, whilst the output 12 of the said second controllable current multiplier 9 and the input 13 of the said first voltage-controlled current source 3 are interconnected to form the said first gyrator port $p_1$–$p_1'$, and if the gyrator 1 further includes at least one capacitor leakage current circuit 14 which is connected between one of the said gyrator ports ($p_1$–$p_1'$) and the input 11 of the voltage-controlled current source (7) coupled to the other port ($p_2$–$p_2'$) and which comprises at least a third controllable current multiplier 15, and if the gyrator also includes a first control current circuit 16 which for adjustment of the circuit quality factor Q is connected to a control input 17 of the said third controllable current multiplier 15, and a second control current circuit 18 which for adjustment of the resonant frequency $f_0$ is connected to a control input 19 common to the said first and second controllable current multipliers 5 and 9.

Voltage-controlled current sources as used in the circuit arrangement shown in FIG. 1 are known and fundamentally comprise a transistor and a resistor and means for correct direct-current biassing of the transistor.

To realize the high input impedance and high transconductance required for accurate voltage-to-current conversion, however, the voltage-controlled current source generally uses an artificial transistor. FIG. 2 shows a possible embodiment of a voltage-controlled current source including such an artificial transistor. In this figure, part 20 enclosed in a broken-line box constitutes the artificial transistor, *b* being the base, *e* the emitter and *c* the collector. The artificial transistor comprises transistors 21, 22 and 23. The collector of the transistor 21 is connected via a high-resistance current source 24 to a supply point of constant potential. The base and the emitter of the transistor 21 are interconnected via a diode 26. The emitter of the transistor 21 is also connected via a resistor 25 to a point of constant potential and via the collector-emitter path of the transistor 22 directly to the output *c* of the device. The base of the transistor 22 is connected to the collector of the transistor 21 via the collector-emitter path of the transistor 23. The base of the transistor 23 is connected to the emitter of the transistor 21. The abovedescribed voltage-controlled current source has the advantage that a highly accurate voltage-to-current conversion is obtained substantially irrespective of the transistor parameters, as is described in more detail in Netherlands Patent Application No. 7,102,199 (PHN. 5420) of prior date.

Current multipliers as used in the circuit arrangement shown in FIG. 1 are also known.

FIG. 3 shows a possible embodiment of such a current multiplier. This embodiment has a first input 27 which is connected to the collector and the base of a transistor 28 arranged to function as a diode. The emitter of the transistor 28 is connected to a point of negative potential via the collector-emitter path of a control transistor 29. The collector of the transistor 29 is also connected to the emitter of a transistor 30 which is arranged to function as a diode and the collector and base of which are connected via a high-resistance direct-current source 31 to a supply point of constant potential. The control transistor 29, which is controlled at its base by a control circuit connected to the base and the collector of the transistor 30 and including a diode 32, ensures that the transistor 30 passes a constant current I. The circuit arrangement further has a second input 33, which is connected to the collector of a transistor 34, and an output 35, which is constituted by the collector of a transistor 36. The base of the transistor 34 is connected to the base of the transistor 30, and the base of the transistor 36 is connected to the base of the transistor 28. The emitters of the transistors 34 and 36 are jointly connected to a point of negative potential via the collector-emitter path of a control transistor 37. The control transistor 37 is controlled at its base by a control circuit which via a diode 38 is connected to the collector of the transistor 34. Using the known transistor equation:

$$V_{be} = \frac{kT}{q} \ln \frac{I}{I_s} \quad (1)$$

where
$I$ = collector current
$I_s$ = saturation current
$V_{be}$ = base emitter voltage
$q$ = charge of the electron
$T$ = absolute temperature
$k$ = Boltzmann's constant it follows that for the circuit arrangement shown in FIG. 3 the following equation applies approximately:

$$\frac{kT}{q} \ln \frac{i_1}{I_s} - \frac{kT}{q} \ln \frac{I}{I_s} + \frac{kT}{q} \ln \frac{I_c}{I_s} - \frac{kT}{q} \ln \frac{i_o}{I_s} = O \quad (2)$$

where
$i_1$ = input current
$I$ = constant current in the circuit including the transistor 30
$I_c$ = control current
$i_o$ = output current From the equation (2) it follows that the current $i_o$ which appears at the output 35 is equal to:

$$i_o = \frac{I_c}{I} \cdot i_1 \quad (3)$$

In this expression the factor $$\frac{I_c}{I}$$

is the multiplying factor which may be changed as required by varying the control current $I_c$ supplied to the second input 33. The controllable current multiplier described has the property of base current compensation so that its control range may be large.

In the circuit arrangement shown in FIG. 1 the multiplying factor of the current multipliers 5 and 9 is determined by the control current $I_c = I_\omega$ supplied to these multipliers via the common control input 19, whilst the multiplying factor of the current multiplier 15 is determined by the control current $I_c = I_Q$ supplied to this multiplier via the control input 17.

For the sake of clarity, in the following explanation of the operation of the circuit arrangement shown in FIG. 1 the multiplying factor of the current multipliers 5 and 9 is indicated by $$m = \frac{I\omega}{I} \qquad (4)$$

whilst for the sake of distinction the current multiplication factor of the current multiplier 15 is indicated by:

$$n = \frac{I_Q}{I} \qquad (5)$$

In contradistinction to the conventional gyrator in which the output current $i_2$ is dependent upon the input voltage $v_1$ and the input current $i_1$ is dependent upon the output voltage $v_2$, so that we have:

$$i_2 = -G_1 v_1 \qquad (6)$$

and $$i_1 = G_2 v_2 \qquad (7)$$

and for the gyrator termination by a capacitor $C_2$ $$v_2 = -i_2 \cdot \frac{1}{pC_2} \qquad (8)$$

in the circuit arrangement according to FIG. 1 the currents $i_2$ and $i_1$ and the voltage $v_2$ also depend upon the said multiplying factors $m$ and $n$.

Thus for this circuit arrangement the following equations apply:

$$i_2 = -m\, G_1 v_1 + nm\, G_2 v_2 \qquad (9)$$

$$i_1 = m\, G_2 v_2 \qquad (10)$$

and $$v_2 = -i_2 \, \frac{1}{pC_2} \qquad (11)$$

Starting from these equations it can mathematically be shown that the input impedance at the input port $p_1$–$p_1'$ is equal to:

$$Z = \frac{v_1}{i_1} = p\, \frac{C_2}{m^2G^2} + \frac{n}{mG} = p\, L_{eq} + r \qquad (12)$$

where $G = G_1 = G_2$.

The equation (12) shows that the equivalent circuit of the input impedance Z comprises the series combination of an inductance $$L_{eq} = \frac{C_2}{m^2G^2} \qquad (13)$$

and a resistance $$r = \frac{n}{mG} \qquad (14)$$

This input impedance together with the capacitor $C_1$ connected to the input port $p_1$–$p_1'$ forms a resonant circuit.

Assuming that $C_1 = C_2 = C$ and substituting the expressions (13) and (14) for $L_{eq}$ and $r$ in the resonant equations we obtain:

$$\omega_o = \frac{1}{\sqrt{LC}} = \frac{mG}{C} \qquad (15)$$

and $$Q = \frac{1}{r}\, \sqrt{\frac{L}{C}} = \frac{mG}{n} \cdot \sqrt{\frac{C}{m^2G^2} \cdot \frac{1}{C}} = \frac{1}{n} \qquad (16)$$

A consideration of the equations (15) and (16) shows that of the two multiplying factors $m$ and $n$ the factor $m$ is found in the equation (15) only and the factor $n$ is found in the equation (16) only. This means that the circuit arrangement according to the invention shown in FIG. 1 has the important property that the resonant frequency and the quality factor of the circuit can be varied independently of one another and instantaneously by simply changing the value of the multiplying factors $m$ and $n$ respectively.

A circuit arrangement which is particularly suitable for given uses is obtained by the provision of a control loop by which tht amplitude of the output signal is automatically maintained constant.

A possible embodiment of a circuit arrangement provided with such a control loop is shown in FIG. 4. In FIG. 4 components corresponding to those of FIG. 1 are denoted by like reference numerals. The circuit arrangement shown in FIG. 4 also has a resonant circuit comprising a gyrator 1 having two capacitors $C_1$ and $C_2$, the gyrator being entirely similar to that of FIG. 1 and comprising voltage-controlled current sources 3 and 7 and current multipliers 5, 9 and 15.

In such a gyrator resonant circuit the circuit quality factor Q can simply and instantaneously be controlled by electronic means so that the amplitude of the output signal is constant.

If a current $a \sin\omega t$ flows through the gyrator resistor G of one voltage-controlled current source 3, in the vicinity of the resonant frequency a current of substantially $a \cos\omega t$ flows through the gyrator resistance G of the other voltage-controlled current source 7, so that without using additional means a 90° phase shift is obtained. Squaring and adding the two signals gives:

$$a^2 \sin^2\omega t + a^2 \cos^2\omega t = a^2 \qquad (17)$$

and this sum signal $a^2$ is a measure of the amplitude of the output signal.

A comparison of this sum signal with a fixed reference signal enables the deviation from the reference signal to be used as a control signal for automatically and instantaneously controlling the output signal to have a constant value. In the embodiment shown in FIG. 4 the currents $a \sin\omega t$ and $a \cos\omega t$ are derived from two additional voltage-controlled current sources 40 and 41 connected to the input and the output respectively of the resonant circuit. The said currents then are squared in current multipliers 42 and 43 which are connected to the outputs of the current sources 40 and 41 respectively and act as squaring devices, the sum of the squares, the signal $a^2$, being supplied to a differential amplifier 44 for comparison with a reference signal derived from a reference source 45. The output of the differential amplifier 44 is connected by a line 46 to the control input 17 of the current multiplier 15 included in the capacitor leakage current circuit 14, and this differential amplifier is such as to supply an output current $I_Q$ which so changes the multiplying factor $$n = \frac{I_Q}{I}$$

that any deviation of the signal $a^2$ from the reference signal is counteracted.

The circuit arrangement described so far may be provided with a second control loop which ensures that the resonant frequency of the resonant circuit automatically and instantaneously follows the frequency of an input signal applied to this circuit. More particularly the second control loop, which in FIG. 4 is designated by 47, comprises a phase discriminator 48 and a low-pass filter 49. The phase discriminator 48 has a first input to which the input signal of the resonant circuit is applied and a second input to which the output signal from the voltage-controlled current source 41 is applied. This phase discriminator acts as a switch, no signal appearing at the output of the low-pass filter 49 if the signals applied to the first and second inputs of the phase discriminator have a mutual phase difference of 90°. Bearing in mind that the input signals applied to the phase discriminator 48 will have such a 90° phase difference only if the resonant circuit is accurately tuned to the frequency of the input signal, it will be clear that the phase discriminator 48 when the resonance frequency of the circuit deviates from the input signal frequency delivers an output signal which in sign and in magnitude corresponds to the sense and value of the deviation. Via the low-pass filter 49 the said output signal is added as a control current $|i_r|$ to the current I which determines the quiescent current setting ($m = 1$) of the current multipliers 5 and 9. The sum $I + |i_r| = I_\omega$ is supplied as a control current to the control input 19 of the current multipliers 5 and 9. The current multiplication factor $$m = \frac{I_\omega}{I}$$

of said current multipliers thus is changed so that the circuit is tuned substantially to the frequency of the input signal.

The abovedescribed frequency feedback loop may be regarded as a first-order regulating system, because the low-pass filter 49 has a very small bandwidth compared with the bandwidth of the gyrator resonant circuit and hence determines the speed of control, as is explained in more detail in a paper in "Rundfunktechnische Mitteilungen", Volume 16 (1972), H 5, pages 202–206. In a first order regulating system the loop amplification may be greatly increased without giving rise to instability. Hence this regulating loop may operate very fast, resulting in substantially instantaneous control.

In general, a frequency feedback loop comprises a lock-in range and a hold range. In most cases the two ranges coincide. The size of the lock-in range is determined by the loop amplification. Because this loop amplification is proportional to the amplitude of the input signal, in order to obtain a constant lock-in range usually the signal before entering the frequency feedback loop is passed through an automatic volume control device (AVC) which delivers a constant output voltage. This conventional method of maintaining constant the lock-in range of a frequency feedback loop has serious disadvantages, one of these being that the signal which controls the automatic volume control is to be derived from some point of the frequency feedback loop, because the automatic volume control must apply only to the signal to be locked in or having been locked in and this may be selected from the received spectrum only in the frequency feedback loop. Moreover the control signal for the automatic volume control generally is delayed to prevent it from affecting the operation of the frequency feedback loop, and this slows down the entire system. In addition, the delayed operation of the automatic volume control introduces distortion. Since the automatic volume control must preceed the frequency feedback loop, because otherwise the lock-in range is not constant, the volume control is required to handle the entire frequency spectrum over the entire dynamic range in order to prevent intermodulation, which is an exacting requirement.

All the abovedescribed difficulties are entirely avoided by the circuit arrangement according to the invention shown in FIG. 4, because this circuit arrangement has the important and advantageous property that the size of the lock-in range of the frequency feedback loop is constant in spite of possible amplitude variations of the input signal, for the loop amplification and hence the lock-in range of the frequency feedback loop are proportional to the amplitude of the input signal and to the phase difference produced in passing through the circuit. This phase difference in turn is proportional to the quality factor Q of the circuit, which factor is varied by the first control loop 46 in inverse proportion to the amplitude of the input signal. The signal produced at the output of the phase discriminator 48 comprises a high-frequency portion and a low-frequency portion the amplitude of which is proportional to the product of the amplitude of the input signal and the quality factor Q of the circuit. This product is maintained constant by the Q-control loop 46, which means that the loop amplification and hence the lock-in range are constant also.

The circuit arrangement shown in FIG. 4 has many possible uses. For example, the control signal which appears at the output of the low-pass filter 49 varies in direct proportion to the frequency of the input signal, whilst the control signal produced at the output of the differential amplifier 44 is inversely proportional to the amplitude of the input signal. Since the circuit arrangement instantaneously follows the frequency of the input signal, it is eminently suitable for detecting both FM and FSK signals and for detecting the carrier of amplitude-modulated signals and for filtering and/or detecting pilot frequencies. It should be mentioned that in these applications the reception of very small signals can be prevented by incorporating a threshold. This may be effected by limiting the maximum value of the quality factor Q of the circuit.

Furthermore the circuit arrangement according to the invention may be operated as an oscillator. This only requires that the value $n$ of the multiplying factor of the (third) current multiplier 15 is made equal to zero, causing the quality factor Q of the circuit to become infinite. It appears that the resulting oscillator can instantaneously be controlled in frequency, enabling an ideal oscillator modulator to be constructed. This important property can be explained as follows. The gyrator equations and the relationship between the currents and the voltages of the capacitors together yield the following equations:

$$G(t)v_2 = -C\frac{dv_1}{dt} \quad (18)$$

and $$G(t)v_1 = C\frac{dv_2}{dt} \quad (19)$$

where the gyrator constants are regarded as the elements to be controlled. Applying $$\frac{d\phi}{dt} = \frac{G(t)}{C},$$

substitution shows that $$v_1 = a \sin\phi\,(t) \quad (20)$$

$$v_2 = -a \cos\phi\,(t) \quad (21)$$

are solutions of the equations (18) and (19). From this it will be clear that the instantaneous frequency $d\phi/dt$ is controllable without delay by varying the gyrator constant G. This means inter alia that such an oscillator can advantageously be used for distortion-free generation of FSK signals having a high bit rate.

Finally it should be mentioned that the circuit arrangement according to the invention is not limited to the embodiments shown in FIGS. 1 and 4. For example, a voltage-controlled current source and a controllable current multiplier different from those shown in FIG. 2 and FIG. 3 respectively may be used. Also, each of the two gyrator series circuits may be provided with a capacitor leakage current circuit. Furthermore the circuit arrangement according to the invention is particularly suitable to be manufactured in integrated-circuit form, as described for example in a paper "An Electronic Gyrator" in IEEE Journal of Solid State Circuits, volume SC-7, No. 6, December 1972, and a version of this gyrator modified in accordance with the invention may also be made in push-pull design.

What is claimed is:

1. Circuit arrangement including a resonant circuit in the form of a gyrator having a first port and a second port which each are terminated by a capacitor, the said gyrator comprising a first series circuit constituted by a first voltage-controlled current source of positive transconductance having a first controllable current multiplier connected to its output and a second series circuit including a voltage-controlled current source of negative transconductance having a second controllable current multiplier connected to its output, the output of the said first controllable current multiplier and the input of the said second voltage-controlled current source being interconnected to form the said second gyrator port, the output of the said second controllable current multiplier and the input of the said first voltage-controlled current source being interconnected to form the said first gyrator port, and at least one capacitor leakage current circuit connected between one of the gyrator ports and the input of the voltage-controlled current source coupled to the other port and including at least a third controllable current multiplier, a first control current circuit which for setting the circuit quality factor Q is connected to a control input of the said third controllable current multiplier, and a second control current circuit which for setting the resonant frequency $f_0$ is connected to a control input common to the said first and second controllable current multipliers.

2. Circuit arrangement as claimed in claim 1, further comprising a Q-control loop which comprises a first squaring unit for producing the square of the signal applied to the input of the said first voltage-controlled current source, a second squaring unit for producing the square of the signal applied to the input of the second voltage-controlled current source, a summing device connected to the outputs of the said first and second squaring units for producing the sum of the squared signals, and a differential amplifier, and in that the control signal applied to the control input of the said third controllable current multiplier is derived from the said differential amplifier to which a reference signal and the sum signal derived from the said summing device are applied.

3. Circuit arrangement as claimed in claim 2, further comprising a frequency feedback loop including a phase discriminator to which the input signal applied to the circuit arrangement and the output signal produced at the output of the circuit arrangement are applied, and a low-pass filter connected to the output of the phase discriminator, and wherein the control signal applied to the common control input of the said first and second controllable current multipliers is constituted by the sum of a fixed current, which determines the quiescent-current setting of said multipliers, and the output current from the said low-pass filter.

4. Circuit arrangement as claimed in claim 3 arranged for detecting FM signals, more particularly FSK signals, wherein the said FM signals to be detected are applied to one of the gyrator ports, the output of the low-pass filter being included in the frequency feedback loop, said output being connected to the commong control input of the said first and second controllable current multipliers, and also forming the output for the detected signals 5. Circuit arrangement as claimed in claim 3 arranged for detecting the carrier of an amplitude-modulated signal, wherein the amplitude-modulated signal is applied to one of the gyrator ports, the other gyrator port forming the output for the detected carrier which is derived form this output with constant amplitude.

6. Circuit arrangement as claimed in claim 1, wherein a control signal is applied to the control input of the third current multiplier included in the capacitor leakage current circuit said control signal being of a fixed value such that the multiplying factor $n$ of this third current multiplier is equal to zero, whereby the circuit arrangement operates as an oscillator, as a result of the quality factor Q of the circuit being infinite.

7. Circuit arrangement as claimed in claim 6, wherein an input signal of variable amplitude is applied as a control signal to the common control input of the first and second current multipliers, whereby the circuit arrangement operates as an "ideal" oscillator-modulator for generating FM signals, in particular FSK signals.

* * * * *